(12) United States Patent
Hasegawa

(10) Patent No.: US 7,514,792 B2
(45) Date of Patent: Apr. 7, 2009

(54) SEMICONDUCTOR DEVICE AND MANUFACTURING METHOD THEREOF

(75) Inventor: Akihiro Hasegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 166 days.

(21) Appl. No.: 11/393,655

(22) Filed: Mar. 31, 2006

(65) Prior Publication Data

US 2006/0180920 A1 Aug. 17, 2006

Related U.S. Application Data

(63) Continuation of application No. PCT/JP03/12671, filed on Oct. 2, 2003.

(51) Int. Cl.
*H01L 23/48* (2006.01)
*H01L 23/52* (2006.01)

(52) U.S. Cl. ................ 257/758; 257/774; 257/E23.145

(58) Field of Classification Search ................ 257/758, 257/774, E23.145
See application file for complete search history.

(56) References Cited

U.S. PATENT DOCUMENTS 5,244,837 A * 9/1993 Dennison .................... 438/622
5,869,393 A * 2/1999 Tseng ........................ 438/622
5,981,377 A 11/1999 Koyama
2003/0227089 A1* 12/2003 Watanabe et al. ........... 257/758
2005/0042816 A1* 2/2005 Watanabe et al. ........... 438/222

FOREIGN PATENT DOCUMENTS

| JP | 9-283617 | 10/1997 |
|---|---|---|
| JP | 2000-77519 | 3/2000 |
| JP | 2000-82738 | 3/2000 |
| JP | 2000-114259 | 4/2000 |
| JP | 2001-345378 | 12/2001 |

* cited by examiner

*Primary Examiner*—Nitin Parekh
(74) *Attorney, Agent, or Firm*—Westerman, Hattori, Daniels & Adrian, LLP.

(57) ABSTRACT

After an interlayer insulation film (1) and a CMP stopper film are formed, wiring trenches are formed. Next, after a barrier metal film (4) and a Cu film (5) are buried in the wiring trenches, the Cu film (5) and the barrier metal film (4) are planarized by CMP or the like until the CMP stopper film is exposed, whereby lower wirings (17) are formed. Next, the CMP stopper film is removed by dry etching, so that surfaces of the lower wirings (17) relatively protrude from their surrounding area. Subsequently, an etching stopper film (6) is formed on the entire surface. Thereafter, via plugs (18) are formed, and upper wirings (19) are further formed in the same manner as the lower wirings (17).

5 Claims, 22 Drawing Sheets

SEMICONDUCTOR DEVICE AND MANUFACTURING METHOD THEREOF

This application is a continuation of international PCT/JP2003/12671, filed on Oct. 2, 2003.

TECHNICAL FIELD

The present invention relates to a semiconductor device and a manufacturing method thereof that adopt a damascene method.

BACKGROUND ART

As a semiconductor integrated circuit gets more miniaturized and comes to have a higher operating speed, the use of copper as a wiring material has been promoted, and the use of a low relative dielectric constant organic insulation film, a Si-based insulation film, or a porous insulation film as an interlayer insulation film provided between wirings has been promoted. However, it is difficult to chemically etch (dry-etch) copper. Specifically, a low vapor pressure of a Cu halide that is an etching product necessitates heating a wafer to high temperature, but a low heat-resistant material such as a mask suffers deterioration due to the high temperature of the wafer. Therefore, a damascene process is often adopted in processing a copper wiring. The damascene process is a method to form wirings by forming recessed portions (wiring trenches) in an interlayer insulation film, burying metal materials, which will become the wirings, in the recessed portions, and planarizing the surface by chemical mechanical polishing (CMP) or the like. The damascene process is categorized into a single damascene method and a dual damascene method. In the single damascene method, metal materials are separately buried in via portions (contact hole portions) and wiring portions, and are polished. In the dual damascene method, metal materials are simultaneously buried in via portions (contact hole portions) and wiring portions, and polished.

Here, a conventional single damascene method will be described. FIG. 16A and FIG. 16B to FIG. 20A and FIG. 20B are views showing, in the order of processes, a manufacturing method of a semiconductor device adopting the conventional single damascene method. FIG. 16A to FIG. 20A are plane views, and FIG. 16B to FIG. 20B are cross-sectional views taken along an I-I line in FIG. 16A to FIG. 20A respectively.

First, semiconductor elements (not shown) such as transistors are formed on a surface of a semiconductor substrate (not shown), and thereafter, as shown in FIG. 16A and FIG. 16B, a coating-type organic interlayer insulation film 101 and a CMP stopper film 102 are formed on or above the semiconductor elements in sequence. Then, wiring trenches are formed in the interlayer insulation film 101 and the CMP stopper film 102. Next, a barrier metal film 104 composed of TiN, TaN or the like is formed on the entire surface, and a copper film 105 is further formed on the entire surface so as to be buried in the wiring trenches. Next, the copper film 105 and the barrier metal film 104 are planarized by CMP or the like until the CMP stopper film 102 is exposed, whereby lower wirings 117 are formed. Thereafter, an etching stopper film 106 and an interlayer insulation film 107 are formed in sequence on the entire surface.

Subsequently, as shown in FIG. 17A and FIG. 17B, via holes (contact holes) 108 passing through the interlayer insulation film 107 and the etching stopper film 106 to reach the lower wirings 117 are formed. At this time, target positions where the via holes 108 are formed are positions right above the lower wirings 117, but due to deviation at the time of exposure or the like, they are often misaligned as shown in FIG. 17A and FIG. 17B.

Next, a barrier metal film 109 composed of TiN, TaN or the like is formed on the entire surface by a sputtering method or a CVD method, and a copper (Cu) film 110 as a conductor film is formed on the entire surface by a plating method or the like so as be buried in the via holes 108. Next, the Cu film 110 and the barrier metal film 109 on the interlayer insulation film 107 are removed by CMP, etch-back or the like, so that via plugs 118 composed of the barrier metal film 109 and the Cu film 110 are formed as shown in FIG. 18A and FIG. 18B.

Thereafter, as shown in FIG. 19A and FIG. 19B, an etching stopper film 111, a coating-type organic interlayer insulation film 112, and a CMP stopper film 113 are sequentially formed on the entire surface. Subsequently, a photoresist film (not shown) is formed on the CMP stopper film 113, and the photoresist film is patterned into a line pattern, so that a resist mask is formed. Then, using the resist mask, the CMP stopper film 113, the interlayer insulation film 112, and the etching stopper film 111 are etched, so that wiring trenches 114 are formed. At this time, target positions where the wiring trenches 114 are formed are positions right above the via plugs 118, but due to deviation at the time of exposure or the like, they are often misaligned as shown in FIG. 19A and FIG. 19B. Thereafter, the resist mask (photoresist film) is removed.

Next, a barrier metal film 115 composed of TiN, TaN or the like is formed on the entire surface, and a copper film 116 is formed on the entire surface so as to be buried in the wiring trenches 114. Next, the copper film 116 and the barrier metal film 115 are planarized by CMP or the like until the CMP stopper film 113 is exposed, so that upper wirings 119 are formed as shown in FIG. 20 and FIG. 20B.

In such a single damascene method, there occurs the misalignment between the lower wirings 117 and the via plugs 118 and between the via plugs 118 and the upper wirings 119, and these misalignments cause poor electrical connection. Further, the current exposure technology cannot completely prevent such misalignments. Moreover, this poor connection increases contact resistance (connection resistance) to increase a heat generation amount in these portions. As a result, long-term stability and reliability of the vias are lowered.

Further, this problem becomes more prominent in a structure where the width of the buried wirings is narrowed to the same level as the width of the via plugs due to the miniaturization and higher density of a semiconductor device, namely, in a structure where so-called borderless vias are formed.

Under such circumstances, disclosed is an art aiming at improving reliability of connection between wirings and via plugs (patent documents 1 and 2).

The patent document 1 (Japanese Patent Application Laid-open No. 2000-114259) describes a method in which recessions are formed around wirings and so on by using a microloading effect of etching. However, the microloading effect is a very unstable phenomenon, and thus it is extremely difficult to control an amount of the recessions formed by the phenomenon. Therefore, this method cannot be adopted in order to improve reliability of the electrical connection.

The patent document 2 (Japanese Patent Application Laid-open No. 2000-82738) describes a method in which via plugs reaching a surface of an interlayer insulation film, in which upper wirings are to be buried, and the via plugs and the upper wirings are made in contact with each other via side surfaces thereof. In this method, however, upper surfaces of the via plugs are exposed to plasma for a long time when the upper wirings are etched. Therefore, even though applicable to via plugs made of, for example, tungsten, this method is difficult to apply to via plugs made of copper. Further, an aspect ratio of each via hole becomes large, which causes a problem in terms of a burying property.

Moreover, the patent documents 1 and 2 aim only at improving reliability of the connection between upper wirings and via plugs, but when the borderless vias come to be adopted in accordance with the miniaturization of the semiconductor device, these prior arts are not sufficient and it is also necessary to ensure sufficient reliability of the electrical connection between via plugs and lower wirings.

Patent Document 1
Japanese Patent Application Laid-open No. 2000-114259
Patent Document 2
Japanese Patent Application Laid-open No. 2000-82738

SUMMARY OF THE INVENTION

It is an object of the present invention to provide a semiconductor device and a manufacturing method thereof capable of ensuring electrical connection between wirings with high reliability and sureness.

A semiconductor device according to the invention of the present application includes: a first wiring; a second wiring formed above the first wiring; and a via plug electrically connecting the first wiring and the second wiring to each other. The first wiring and the via plug are electrically connected to each other, with an upper surface of the first wiring and a lower surface of the via plug being in contact with each other, and a side surface of the first wiring and a side surface of the via plug being in contact with each other. Further, the via plug and the second wiring are electrically connected to each other, with an upper surface of the via plug and a lower surface of the second wiring being in contact with each other, and a side surface of the via plug and a side surface of the second wiring being in contact with each other.

In a manufacturing method of a semiconductor device according to the invention of the present application, after a first opening part is formed in a first insulation film, a first metal film is buried in the first opening part. Next, the first insulation film is etched, so that a surface of the first insulation film is made retreated from a surface of the metal film. Next, a second insulation film is formed on an entire surface. Thereafter, a second opening part reaching the first metal film is formed in the second insulation film. Then, a second metal film is buried in the second opening part.

DETAILED DESCRIPTION OF THE PREFERRED EMBODIMENTS

Hereinafter, embodiments of the present invention will be concretely described with reference to the attached drawings. For convenience sake, in the embodiments below, the structure of a semiconductor device will be described along with a manufacturing method thereof.

First Embodiment

First, a first embodiment of the present invention will be described. FIG. 1A and FIG. 1B to FIG. 11A and FIG. 11B are views showing, in the order of processes, a manufacturing method of a semiconductor device according to the first embodiment of the present invention. FIG. 1A to FIG. 11A are plane views and FIG. 1B to FIG. 11B are cross-sectional views taken along an I-I line in FIG. 1A to FIG. 11A respectively. In the first embodiment, the semiconductor device is manufactured by a single damascene method.

Figure 1A:
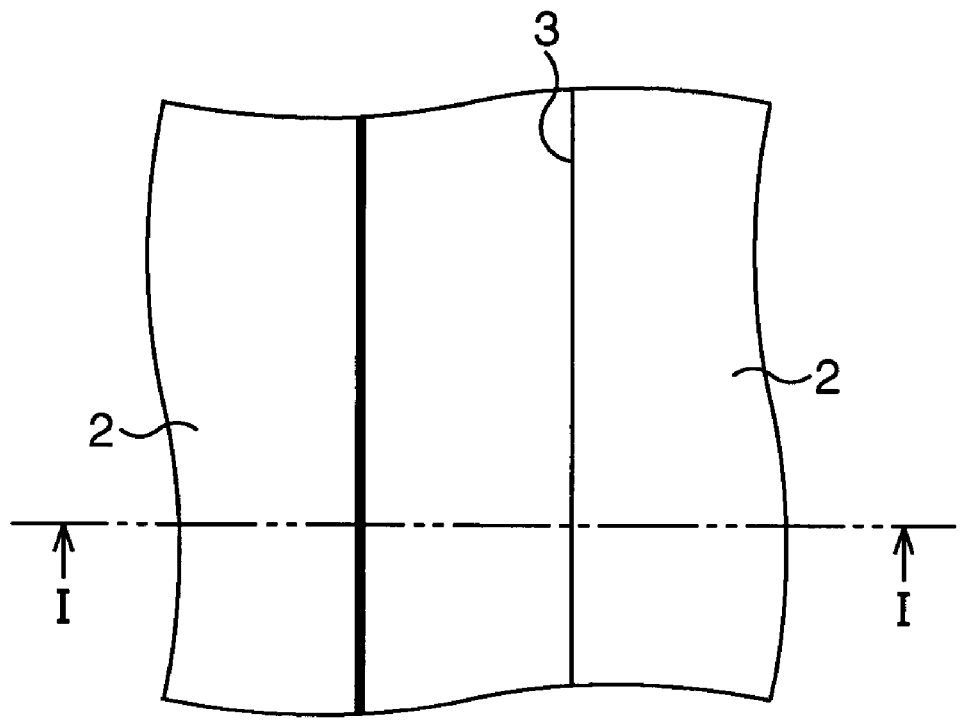
FIG. 1A and FIG. 1B are views showing a manufacturing method of a semiconductor device according to a first embodiment of the present invention.
Figure 1B:
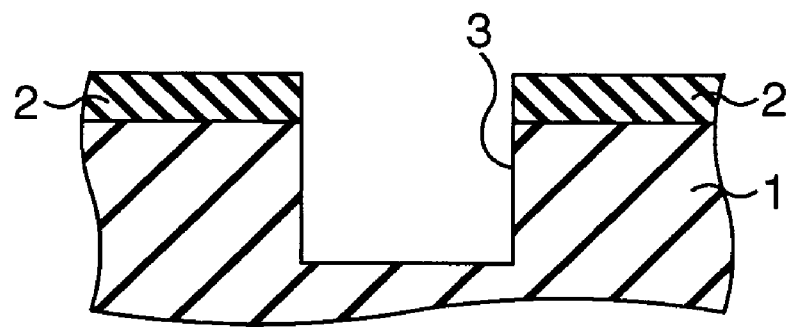

In this embodiment, after semiconductor elements (not shown) such as transistors are formed on a surface of a semiconductor substrate (not shown), a coating-type organic, for example, interlayer insulation film 1 and a CMP stopper film 2 are sequentially formed on or above the semiconductor elements, as shown in FIG. 1A and FIG. 1B. In this embodiment, a first insulation film is composed of the interlayer insulation film 1 and the CMP stopper film 2. Then, wiring trenches 3 are formed in the interlayer insulation film 1 and the CMP stopper film 2 by dry etching. As the CMP stopper film 2, for example, a SiC film is formed.

Figure 2A:
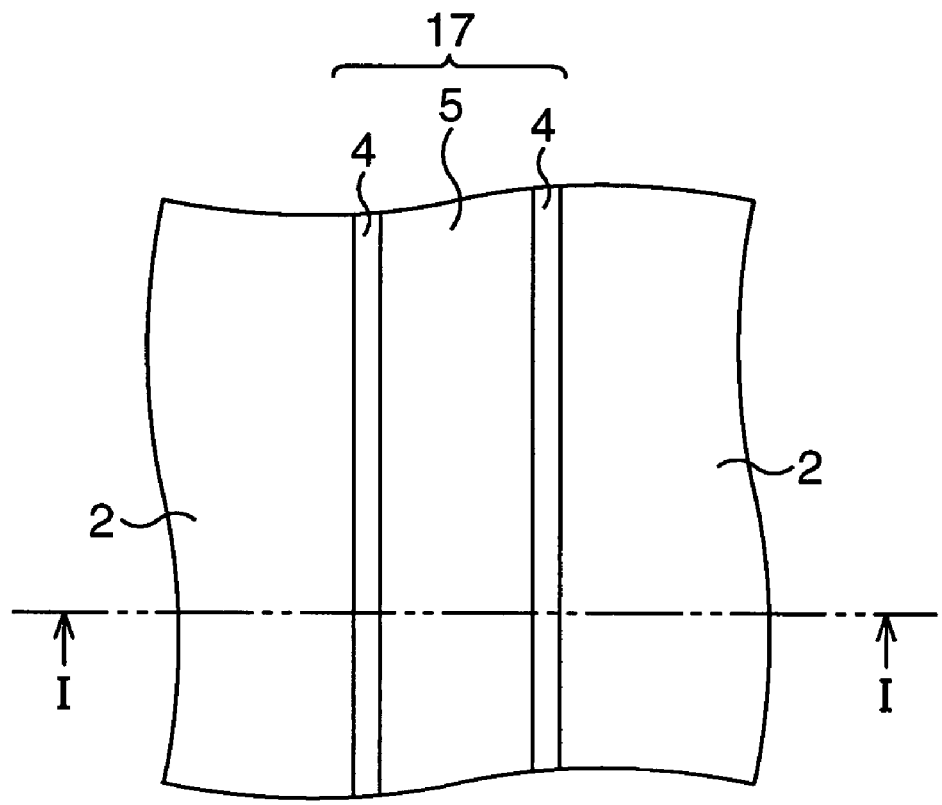
FIG. 2A and FIG. 2B are views, subsequent to FIG. 1A and FIG. 1B, showing the manufacturing method of the semiconductor device according to the first embodiment of the present invention.
Figure 2B:
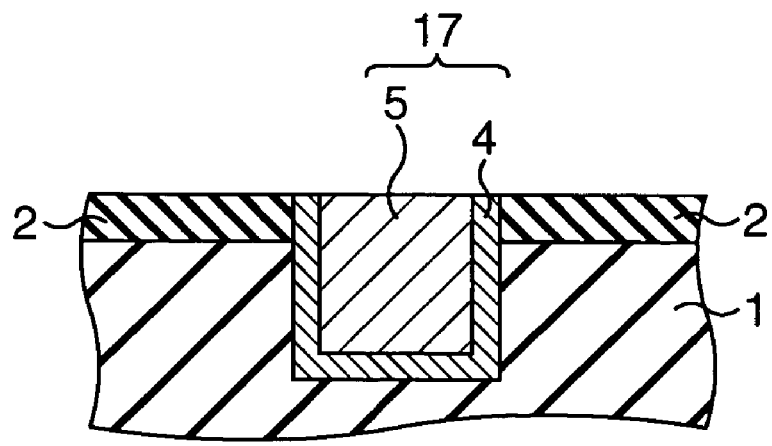

Next, a barrier metal film 4 composed of TiN, TaN, Ta or the like is formed on the entire surface by a sputtering method or a CVD method, and a copper (Cu) film 5 is further formed on the entire surface by a plating method or the like so as to be buried in the wiring trenches 3. Next, the Cu film 5 and the barrier metal film 4 are planarized by CMP or the like until the CMP stopper film 2 is exposed, whereby lower wirings 17 are formed as shown in FIG. 2A and FIG. 2B.

Incidentally, if CMP can be stopped on a surface of the interlayer insulation film 1, the CMP stopper film 2 need not be formed. However, the CMP stopper film 2 is preferably formed since it is capable of functioning also as a film that controls a protrusion amount of the Cu film 5 and the barrier metal film 4 (a protrusion amount control film), as will be described later.

Figure 3A:
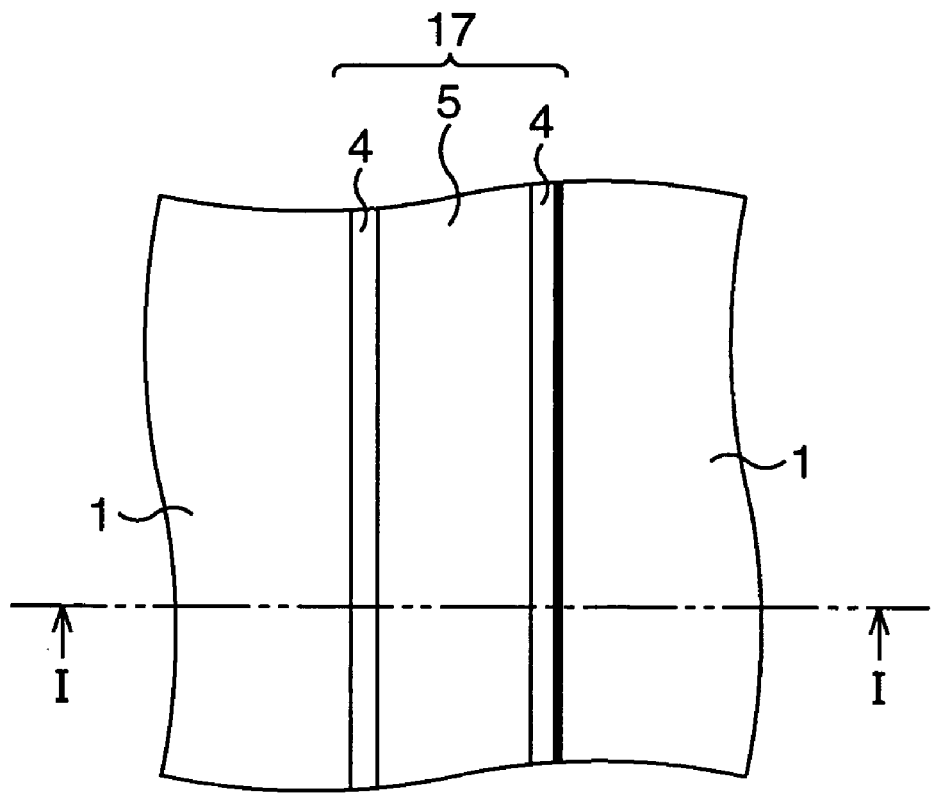
FIG. 3A and FIG. 3B are views, subsequent to FIG. 2A and FIG. 2B, showing the manufacturing method of the semiconductor device according to the first embodiment of the present invention.
Figure 3B:
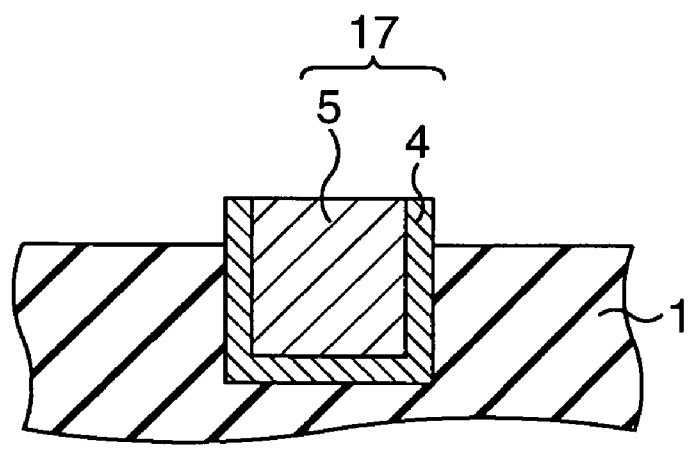

Thereafter, as shown in FIG. 3A and FIG. 3B, the CMP stopper film 2 is removed by, for example, dry etching using plasma, so that surfaces of the lower wirings 17 relatively protrude from their surrounding area. Further, the interlayer insulation film 1 may be made retreated as required so that the lower wirings 17 protrude more. A preferable range of the protrusion degree of the lower wirings 17 will be described later. The protrusion amount of the lower wirings 17 in this event may be, for example, adjusted with the thickness of the CMP stopper film 2. Further, entire-surface etch-back or wet etching is preferable for removing the CMP stopper film 2. This is because high in-plane controllability is obtained regarding the protrusion amount of the lower wirings 17.

Figure 4A:
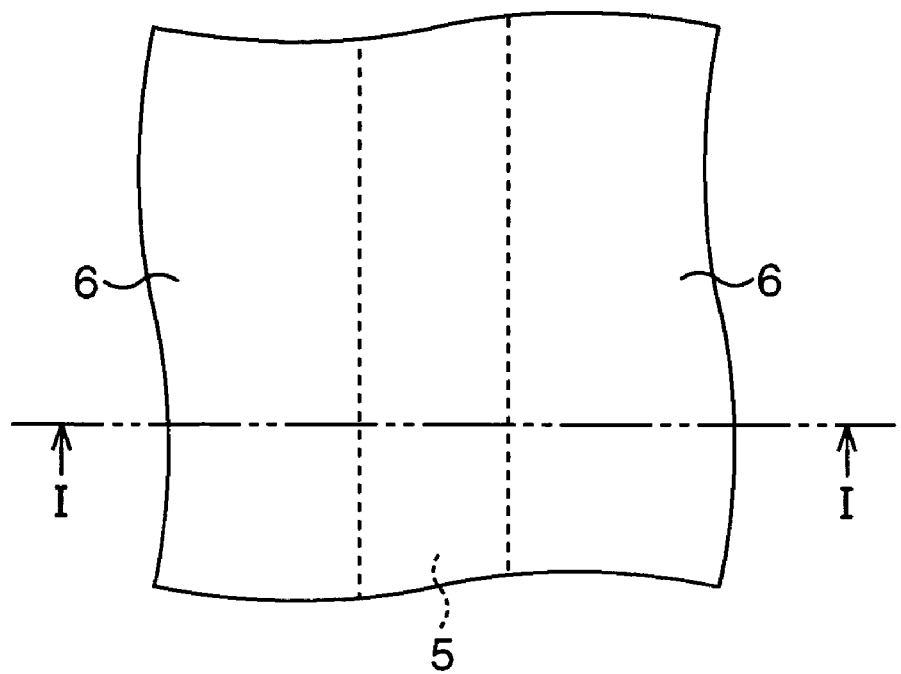
FIG. 4A and FIG. 4B are views, subsequent to FIG. 3A and FIG. 3B, showing the manufacturing method of the semiconductor device according to the first embodiment of the present invention.
Figure 4B:
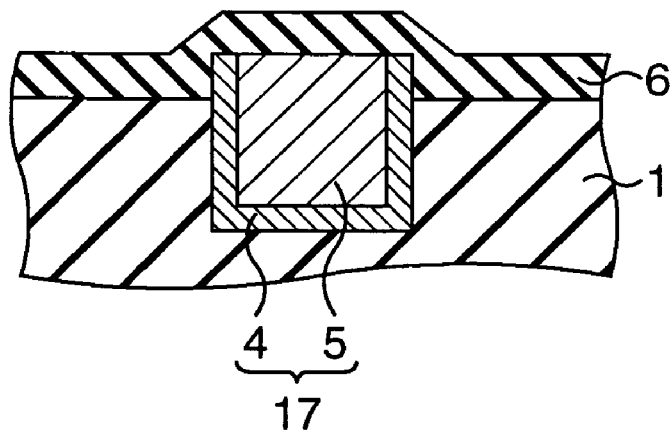

Subsequently, as shown in FIG. 4A and FIG. 4B, an etching stopper film 6 is formed on the entire surface. As the etching stopper film 6, for example, a SiC film is formed.

Figure 5A:
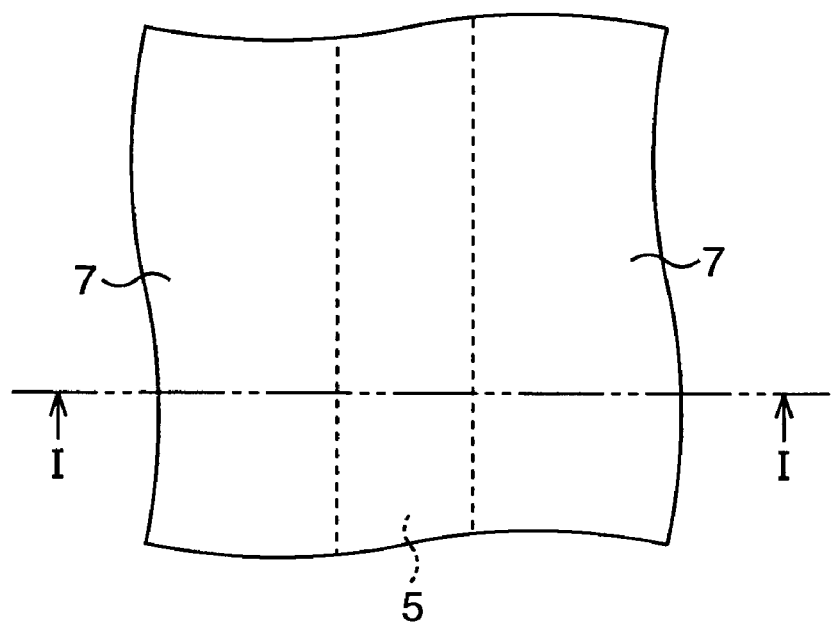
FIG. 5A and FIG. 5B are views, subsequent to FIG. 4A and FIG. 4B, showing the manufacturing method of the semiconductor device according to the first embodiment of the present invention.
Figure 5B:
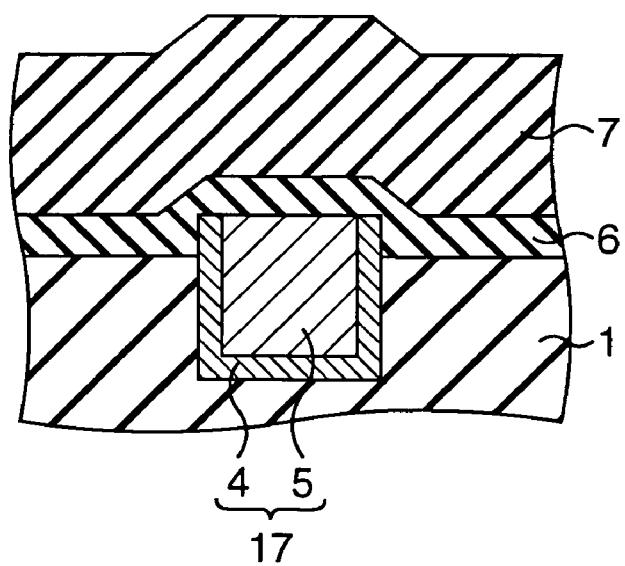

Next, as shown in FIG. 5A and FIG. 5B, an interlayer insulation film 7 is formed on the etching stopper film 6. As the interlayer insulation film 7, for example, a SiO$_2$ film or the like is formed. In this embodiment, a second insulation film is composed of the etching stopper film 6 and the interlayer insulation film 7. As the interlayer insulation film 7, a coating-type Si-containing insulation film may be formed. A level difference is made on a surface of the etching stopper film 6, but when the coating-type insulation film is formed thereafter, a surface thereof becomes flat and a surface of a film formed thereon also becomes flat. When a coating-type low dielectric constant film or a CVD film is formed as the interlayer insulation film 7, a level difference is made on a surface of the interlayer insulation film 7, and therefore this surface is preferably planarized.

Figure 6A:
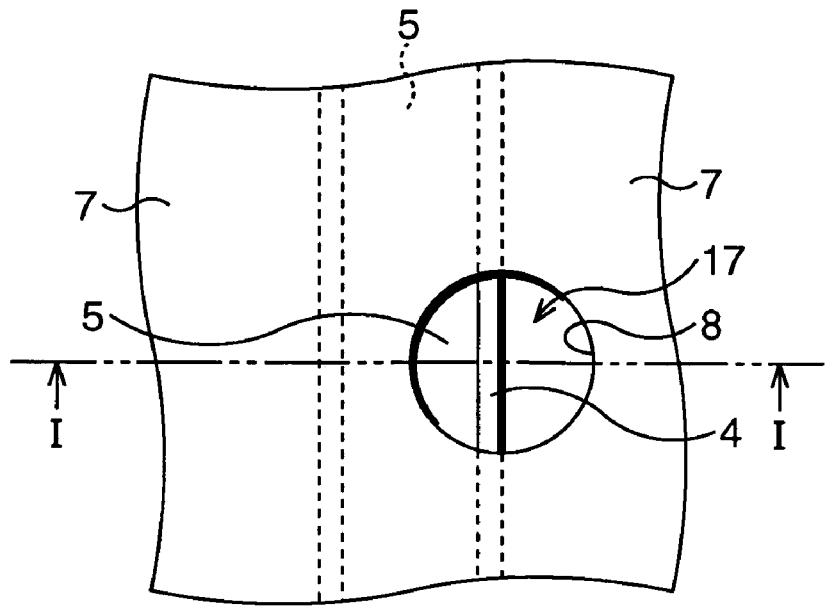
FIG. 6A and FIG. 6B are views, subsequent to FIG. 5A and FIG. 5B, showing the manufacturing method of the semiconductor device according to the first embodiment of the present invention.
Figure 6B:
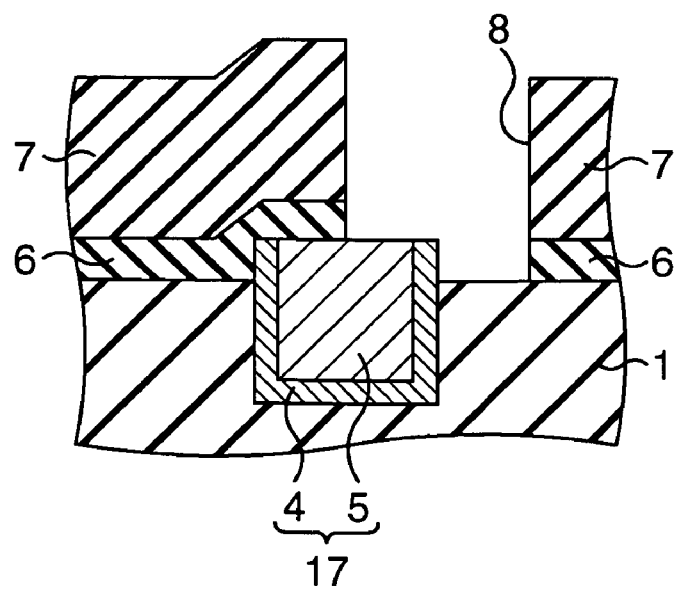

Next, as shown in FIG. 6A and FIG. 6B, via holes (contact holes) 8 passing through the interlayer insulation film 7 and the etching stopper film 6 to reach the lower wirings 17 are formed. At this time, target positions where the via holes 8 are formed are positions right above the lower wirings 17, but due to deviation at the time of exposure or the like, misalignment may occur as shown in FIG. 6A and FIG. 6B.

Figure 7A:
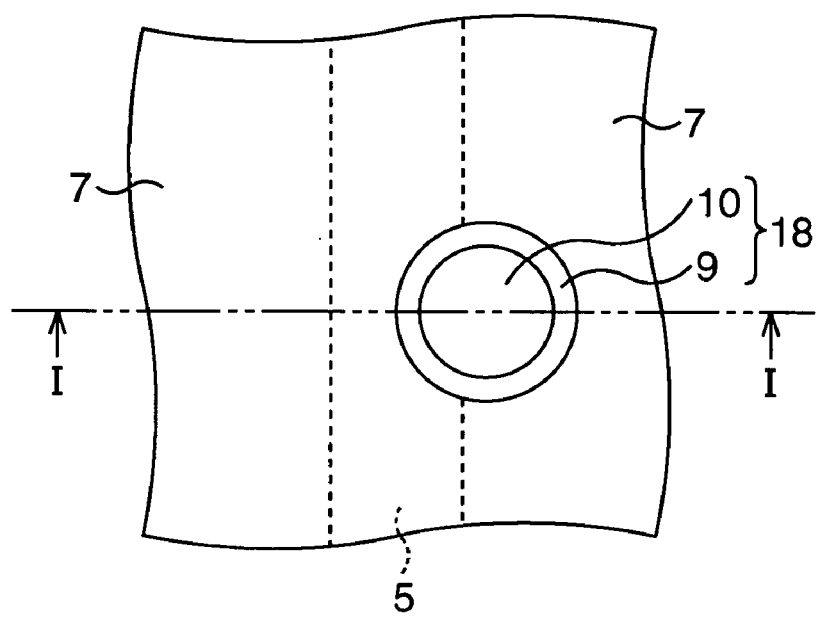
FIG. 7A and FIG. 7B are views, subsequent to FIG. 6A and FIG. 6B, showing the manufacturing method of the semiconductor device according to the first embodiment of the present invention.
Figure 7B:
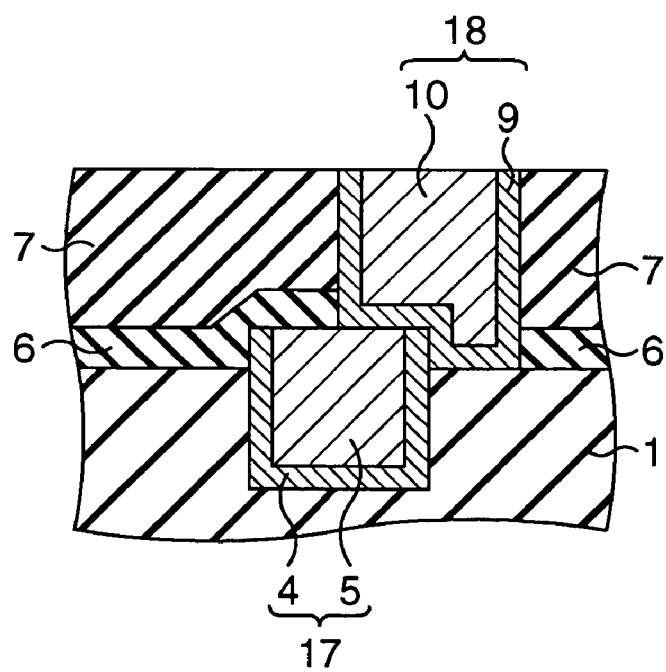

Thereafter, in the same manner as in the formation of the barrier metal film 4, a barrier metal film 9 is formed on the entire surface by a sputtering method or a CVD method, and a copper (Cu) film 10 as a conductor film is further formed on the entire surface by a plating method or the like so as to be buried in the via holes 8. Subsequently, the Cu film 10 and the barrier metal film 9 on the interlayer insulation film 7 are removed by CMP, etch-back or the like, whereby via plugs 18 including the barrier metal film 9 and the Cu film 10 are formed as shown in FIG. 7A and FIG. 7B.

Here, the case where the interlayer insulation film 7 functions as a CMP stopper film is described, but if the interlayer insulation film 7 does not fully function as the CMP stopper film, a film similar to the CMP stopper film 2 may be formed thereon.

Figure 8A:
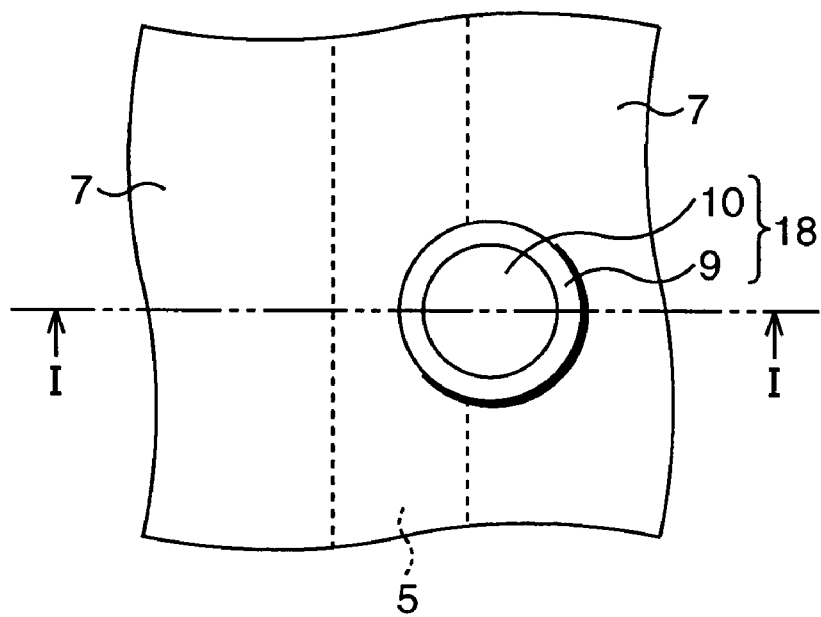
FIG. 8A and FIG. 8B are views, subsequent to FIG. 7A and FIG. 7B, showing the manufacturing method of the semiconductor device according to the first embodiment of the present invention.
Figure 8B:
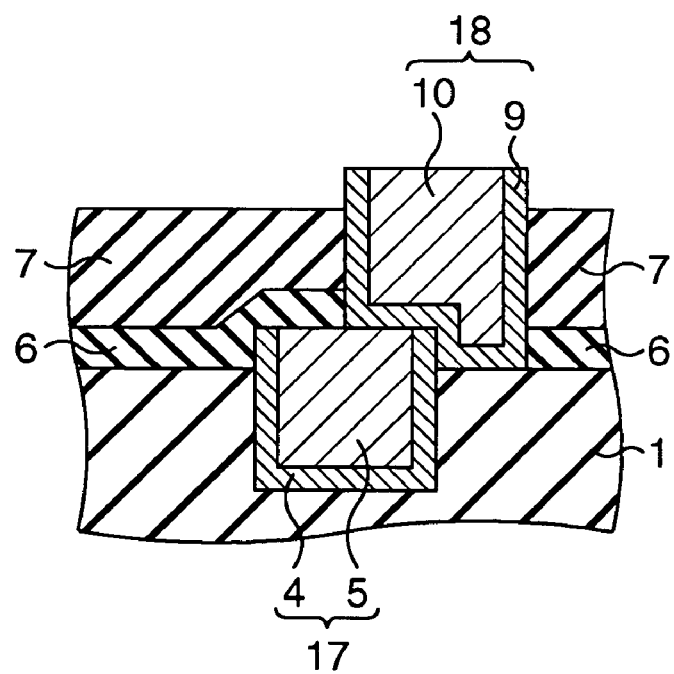

Next, as shown in FIG. 8A and FIG. 8B, a superficial portion of the interlayer insulation film 7 is etched, whereby the surface of the interlayer insulation film 7 is made retreated from surfaces of the via plugs 18, so that the surfaces of the via plugs 18 relatively protrude from their surrounding area. A preferable range of a protrusion degree of the via plugs 18 will be described later.

Figure 9A:
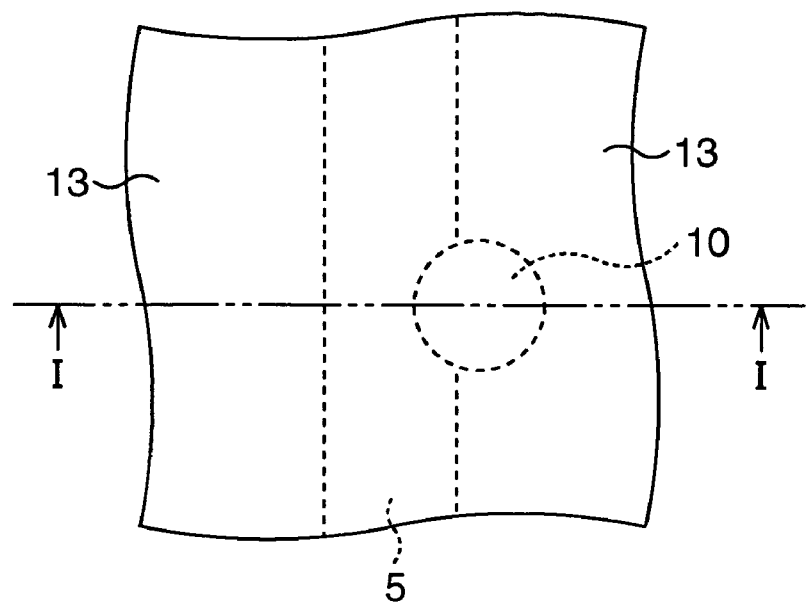
FIG. 9A and FIG. 9B are views, subsequent to FIG. 8A and FIG. 8B, showing the manufacturing method of the semiconductor device according to the first embodiment of the present invention.
Figure 9B:
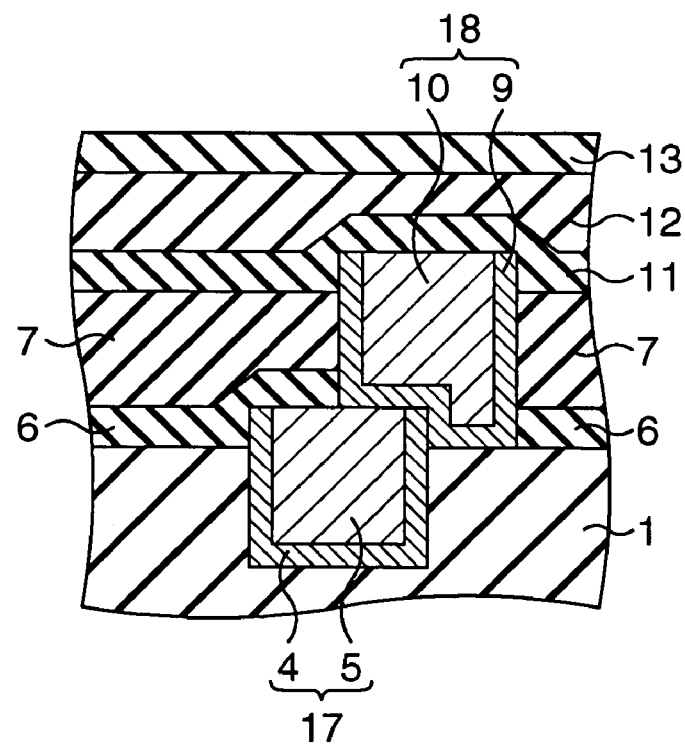

Next, as shown in FIG. 9A and FIG. 9B, an etching stopper film 11, a coating-type organic, for example, interlayer insulation film 12, and a CMP stopper film 13 are sequentially formed on the entire surface. As the etching stopper film 11 and the CMP stopper film 13, for example, SiC films are formed. A level difference is made on a surface of the etching stopper film 11, but when the coating-type interlayer insulation film 12 is formed thereafter, a surface thereof becomes flat and a surface of the CMP stopper film 13 also becomes flat.

Figure 10A:
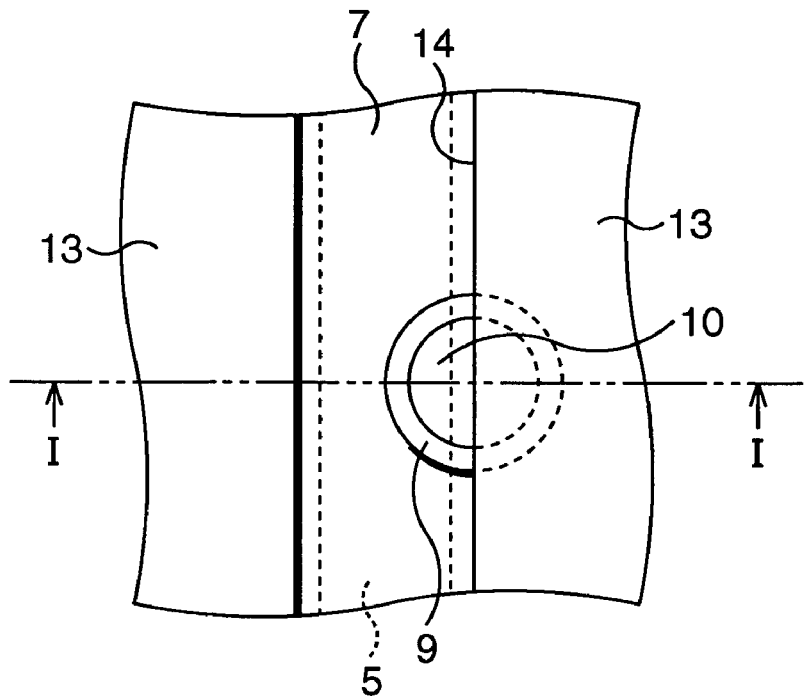
FIG. 10A and FIG. 10B are views, subsequent to FIG. 9A and FIG. 9B, showing the manufacturing method of the semiconductor device according to the first embodiment of the present invention.
Figure 10B:
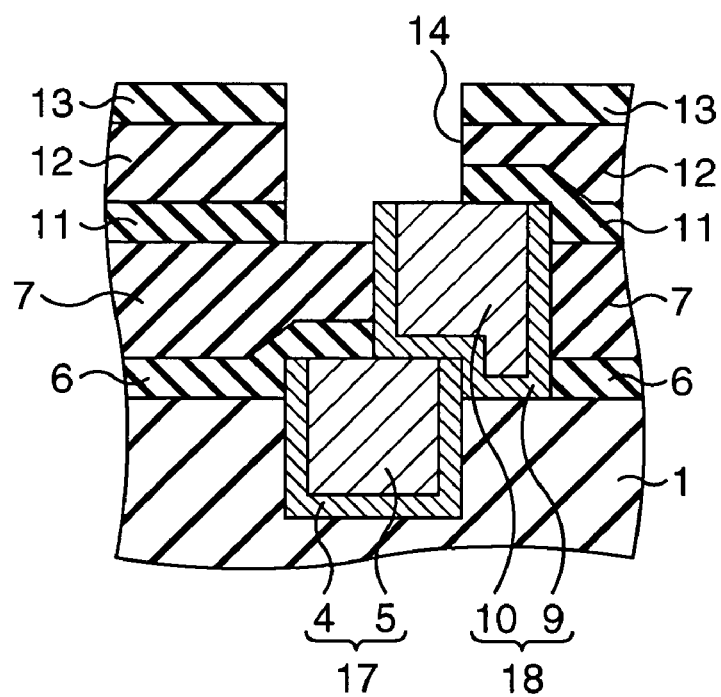

Thereafter, as shown in FIG. 10A and FIG. 10B, a photoresist film (not shown) is formed on the CMP stopper film 13, and this photoresist film is patterned into a line pattern, so that a resist mask is formed. Then, by using the resist mask, the CMP stopper film 13, the interlayer insulation film 12, and the etching stopper film 11 are etched, whereby wiring trenches 14 are formed. At this time, target positions where the wiring trenches 14 are formed are positions right above the via plugs 18, but due to deviation at the time of exposure or the like, misalignment may occur as shown in FIG. 10A and FIG. 10B. The resist mask (photoresist film) is removed when the organic interlayer insulation film 12 is etched.

Figure 11A:
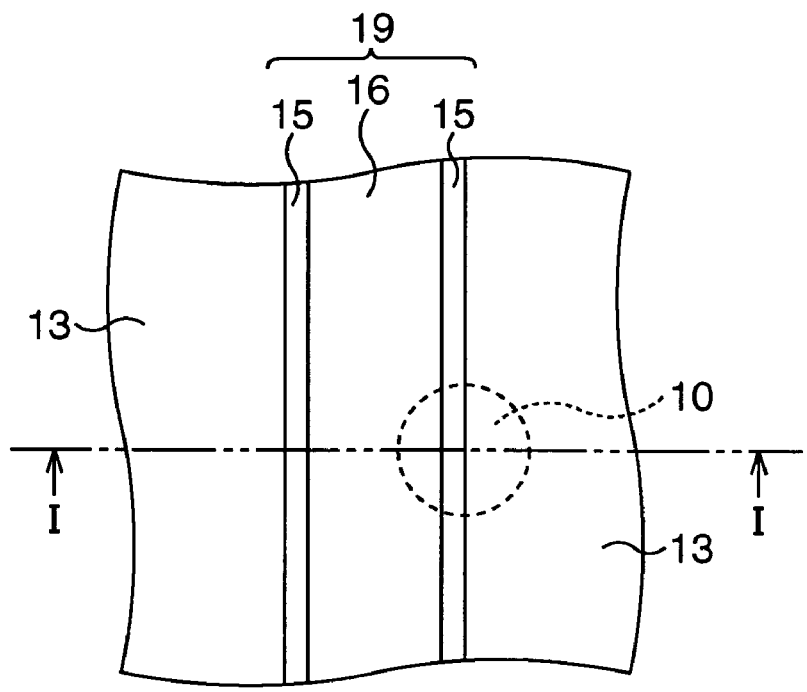
FIG. 11A and FIG. 11B are views, subsequent to FIG. 10A and FIG. 10B, showing the manufacturing method of the semiconductor device according to the first embodiment of the present invention.
Figure 11B:
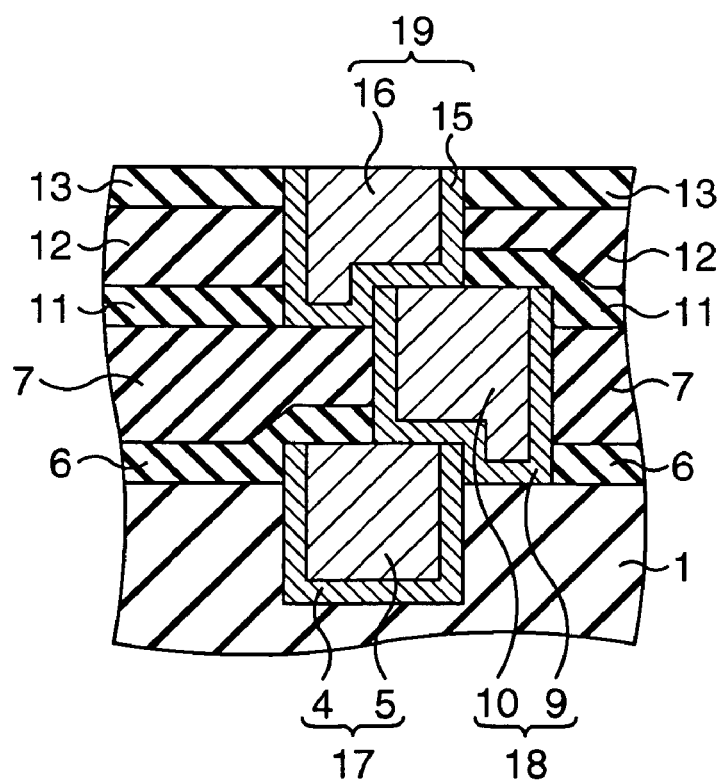

Next, a barrier metal film 15 composed of TiN, TaN or the like is formed on the entire surface, and a Cu film 16 is further formed on the entire surface so as to be buried in the wiring trenches 14. Next, the Cu film 16 and the barrier metal film 15 are planarized by CMP or the like until the CMP stopper film 13 is exposed, whereby upper wirings 19 are formed as shown in FIG. 11A and FIG. 11B.

Thereafter, a multilayer wiring structure or the like is further formed as required, whereby the semiconductor device is completed.

According to the first embodiment as described above, even if the misalignment occurs in forming the via holes 8, the lower wirings 17 and the via plugs 18 are in contact with each other, not only via upper surfaces and lower surfaces thereof but also via side surfaces thereof. Therefore, a contact area of the lower wirings 17 and the via plugs 18 is large, which makes it possible to reduce an increase in resistance value. Similarly, even if the misalignment occurs in forming the wiring trenches 14, the via plugs 18 and the upper wirings 19 are in contact with each other not only via upper surfaces and lower surfaces thereof but also via side surfaces thereof. Therefore, a contact area of the via plugs 18 and the upper wirings 19 is also large, which makes it possible to reduce an increase in resistance value.

Figure 12:
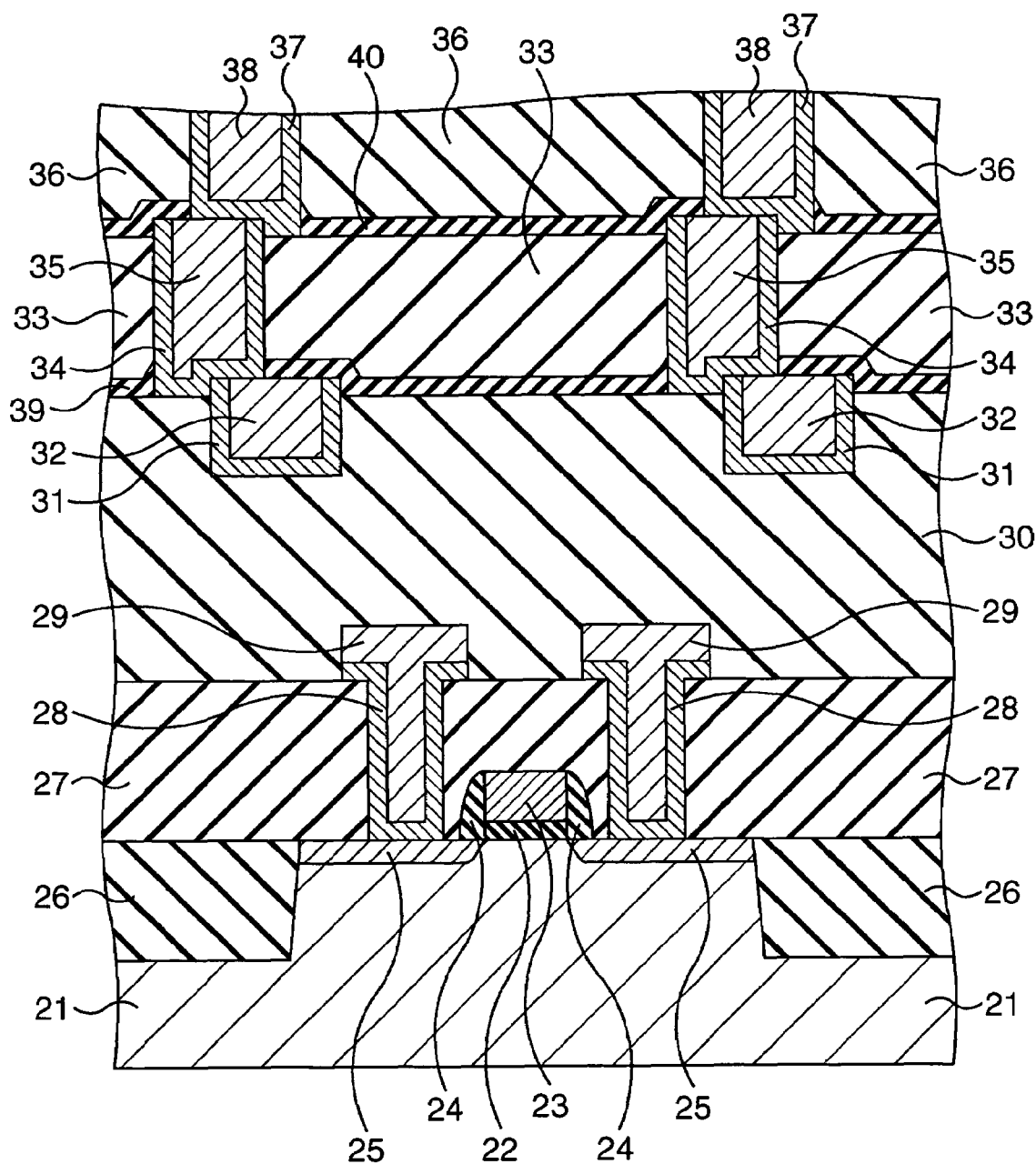
FIG. 12 is a cross-sectional view showing an example of a structure of a semiconductor device manufactured by applying the first embodiment.

FIG. 12 is a cross-sectional view showing an example of a structure of the semiconductor device manufactured by applying the first embodiment. In this semiconductor device, isolating insulation films 26 are formed on a surface of a semiconductor substrate 21 such as a Si substrate. Further, in each element active region defined by the isolating insulation films 26, a gate insulation film 22 and a gate electrode 23 are formed on the semiconductor substrate 21, and sidewall insulation film 24 is formed on sides of the gate electrode 23. Further, source/drain diffusion layers 25 are formed on a surface of the semiconductor substrate 21 so as to sandwich the gate electrode 23 in a plane view. MOS transistors are thus formed.

An interlayer insulation film 27 are further formed on the MOS transistors, and contact holes reaching the source/drain diffusion layers 25 are formed in this interlayer insulation film. A barrier metal film 28 and a wiring material 29 are buried in the contact holes. Further, contract holes, though not shown, reaching the gate electrodes 23 are formed in the interlayer insulation film 27, and a wiring material and so on are also buried therein.

Note that a large number of other semiconductor elements, thought not shown, are formed on the semiconductor substrate, and a large number of wiring materials connected thereto are buried in the interlayer insulation film 27.

An interlayer insulation film 30 is formed on the interlayer insulation film 27, and wirings including a barrier metal film 31 and a Cu film 32 are buried in the interlayer insulation film 30. These wirings are connected to the semiconductor elements formed on the semiconductor substrate. The interlayer insulation film 30 is made of, for example, a coating-type organic film and corresponds to the interlayer insulation film 1. The barrier metal film 31 and the Cu film 32 correspond to the barrier metal film 4 and the Cu film 5 respectively.

An interlayer insulation film 33 is formed on the interlayer insulation film 30 via an etching stopper film 39, and via plugs including a barrier metal film 34 and a Cu film 35 are buried in the interlayer insulation film 33. The via plugs are connected to the Cu film 32 and so on. The etching stopper film 39 is made of, for example, a SiC film and corresponds to the etching stopper film 6. The interlayer insulation film 33 is made of, for example, a $SiO_2$ film and corresponds to the interlayer insulation film 7. The barrier metal film 34 and the Cu film 35 correspond to the barrier metal film 9 and the Cu film 10 respectively.

An interlayer insulation film 36 is formed on the interlayer insulation film 33 via an etching stopper film 40, and wirings including a barrier metal film 37 and a Cu film 38 are buried in the interlayer insulation film 36. These wirings are connected to the Cu film 35 and so on. The etching stopper film 40 is made of, for example, a SiC film and corresponds to the etching stopper film 11. The interlayer insulation film 36 is made of, for example, a coating-type organic film and corresponds to the interlayer insulation film 12. The barrier metal film 37 and the Cu film 38 correspond to the barrier metal film 15 and the Cu film 16 respectively. A multilayer wiring structure, though not shown, is further formed on the interlayer insulation film 36.

Figure 20A:
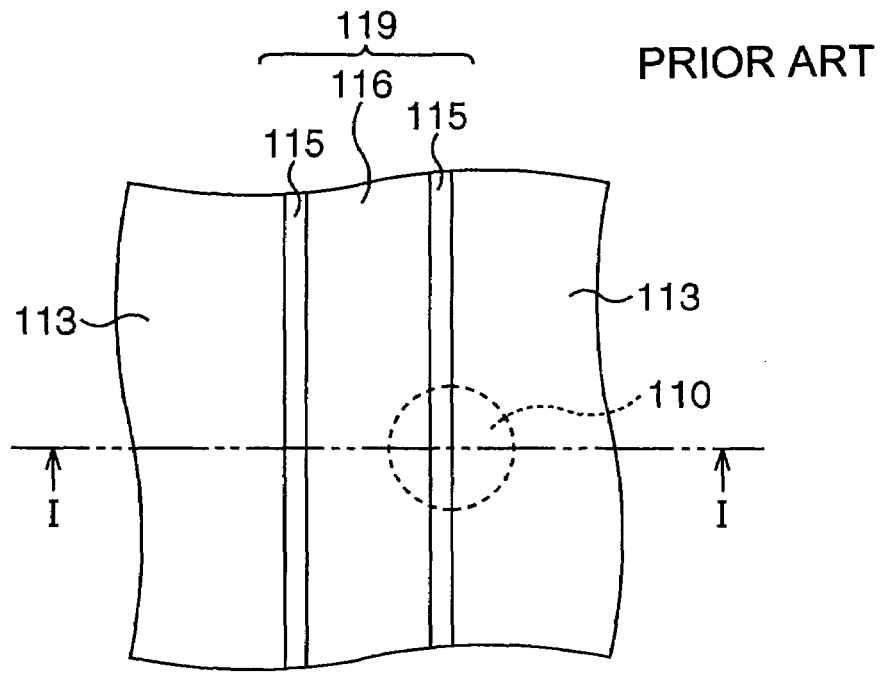
FIG. 20A and FIG. 20B are views, subsequent to FIG. 19A and FIG. 19B, showing the manufacturing method of the semiconductor device, using the conventional single damascene method.
Figure 20B:
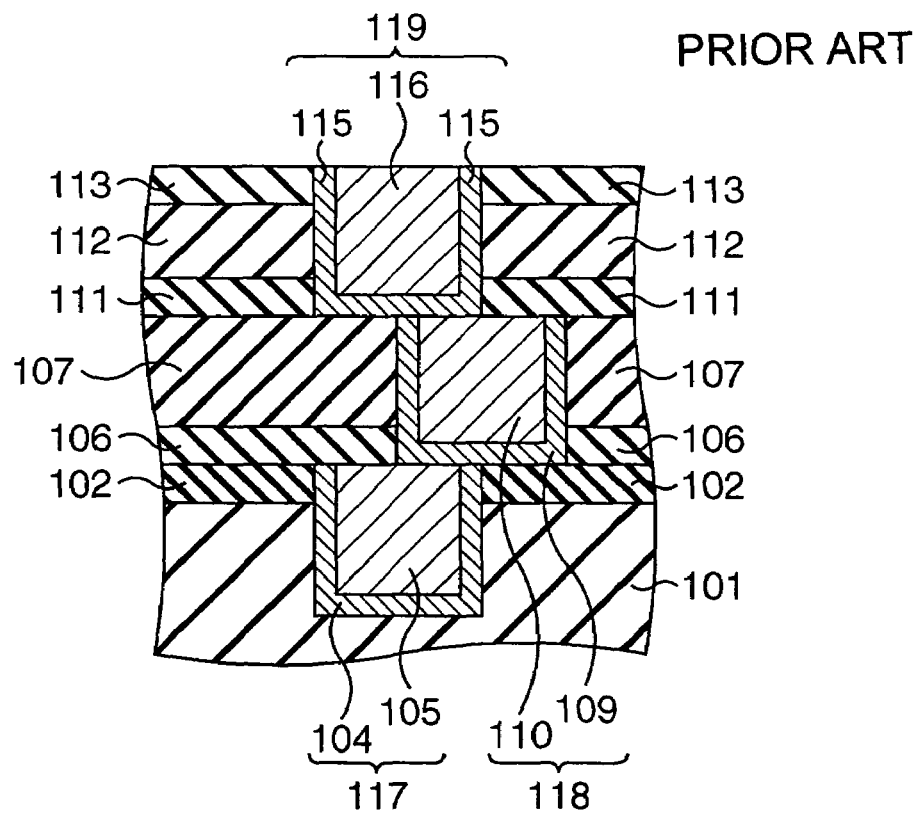

Here, results of an experiment actually conducted by the inventor of the present application will be described. In this experiment, as an example, the structure shown in FIG. 11A and FIG. 11B was made according to the first embodiment. In addition, as a comparative example, the structure shown in FIG. 20A and FIG. 20B was made by a conventional method shown in FIG. 16A and FIG. 16B to FIG. 20A and FIG. 20B. Then, a resistance value between an upper wiring and a lower wiring was measured regarding the example and the comparative example. Note that the width of the upper wiring and the lower wiring was set to 200 nm and the diameter of the via plug was set to 150 nm to 180 nm. Besides, misalignment of about 100 nm was intentionally caused between the via plug and the lower wiring and between the upper wiring and the via plug. Only one via plug is provided between the upper wiring and the lower wiring. Then, a large number of such samples were prepared and the statistics were taken.

Figure 13:
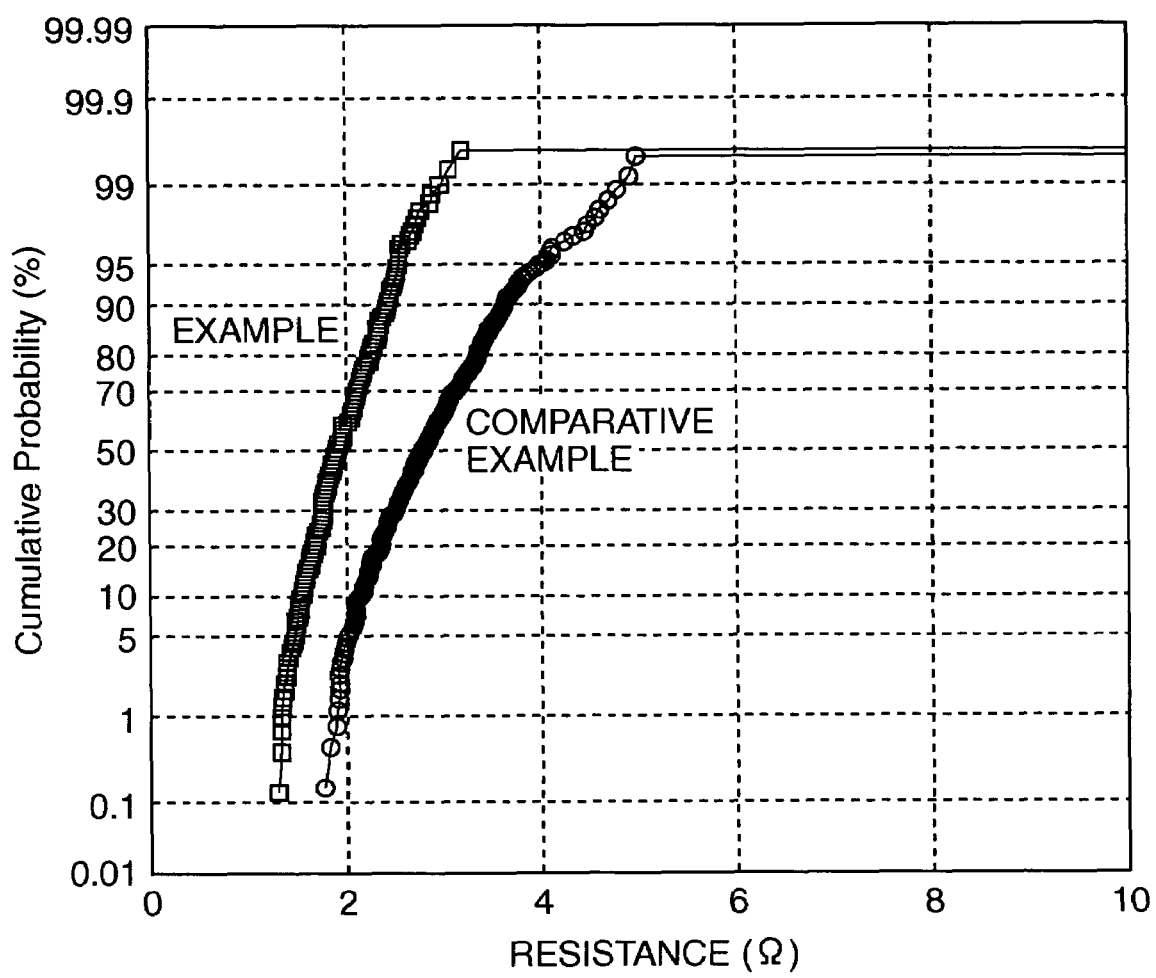
FIG. 13 is a graph showing results of experiments actually conducted by the inventor of the present application.

The measurement results are shown in FIG. 13. The comparison between the example and the comparative example shows that lower wiring resistance was obtained in the examples as shown in FIG. 13. Moreover, variation in the wiring resistance is smaller in the example.

Figure 14A:
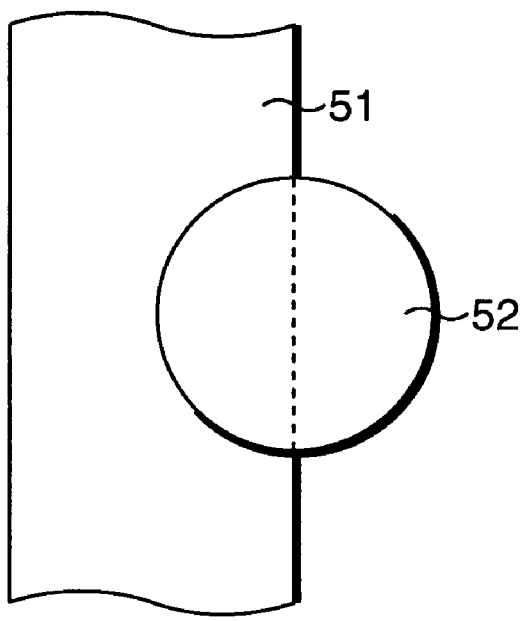
FIG. 14A is a schematic view showing a state where a half of a via plug is positioned outside an edge portion of a lower wiring.

Next, a preferable range of the protrusion degree of the lower wiring in a connection portion of the lower wiring and the via plug will be described. Here, assuming that a planar shape of the via plug is a circle, the preferable range for obtaining a sufficiently low resistance value even if a half the area of the circle is positioned outside an edge portion of the lower wiring due to the misalignment will be described. FIG. 14A is a schematic view showing a state where a half of a via plug is positioned outside an edge portion of a lower wiring.

When a planar shape of a via plug 52 is a circle with a radius of "a", a width of a portion where side surfaces of the via plug 52 and a lower wiring 51 are in contact with each other (the broken-line portion in FIG. 14A) due to the protrusion of the lower wiring 51 is "2a". Therefore, an area of the portion where they are in contact with each other is "$2a \times h_1$", where $h_1$ is a protruding height of the lower wiring 51. Meanwhile, an area of a lower surface of the via plug 52 that cannot be in contact with an upper surface of the lower wiring 51 due to the protrusion is "$\pi a^2/2$". If "$2a \times h_1$" compensates this area, the height $h_1$ is "$\pi a/4$" or more. Therefore, the protrusion degree of the lower wiring is preferably "$\pi a/4$" or more, where "a" is the radius of the via plug.

Figure 14B:
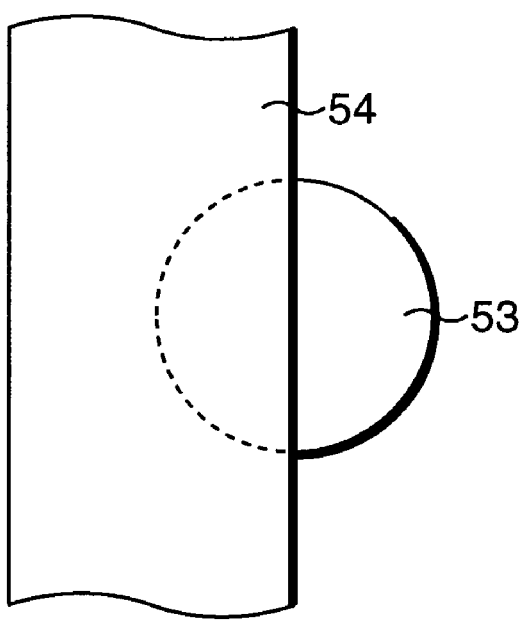
FIG. 14B is a schematic view showing a state where a half of a via plug is positioned outside an edge portion of an upper wiring.

Next, a preferable range of the protrusion degree of the via plug in a connection portion of the via plug and the upper wiring will be described. Here, assuming that the planar shape of the via plug is a circle, the preferable range for obtaining a sufficiently low resistance value even if a half of the via plug is positioned outside an edge portion of the upper wiring due to the misalignment will be described. FIG. 14B is a schematic view showing a state where a half of a via plug is positioned outside an edge portion of an upper wiring.

When the planar shape of a via plug 53 is a circle with a radius of "b", a length of a portion where side surfaces of the via plug 53 and the upper wiring are in contact with each other due to the protrusion of the via plug 53 (the broken line portion in FIG. 14B) is "$\pi b$". Therefore, an area of the portion where they are in contact with each other is "$\pi b \times h_2$", where $h_2$ is a protruding height of the via plug 53. Meanwhile, an area of an upper surface of the via plug 53 that cannot be in contact with a lower surface of the upper wiring 54 due to the protrusion is "$\pi b^2/2$". Then, if "$\pi b \times h_2$" compensates this area, the height $h_2$ is "b/2" or more. Therefore, the protrusion degree of the via plug is preferably "b/2" or more, where "b" is the radius of the via plug.

Second Embodiment

Next, a second embodiment of the present invention will be described. FIG. 15A to FIG. 15E are cross-sectional views showing, in the order of processes, a manufacturing method of a semiconductor device according to the second embodiment of the present invention. In the second embodiment, the semiconductor device is manufactured by a dual damascene method.

Figure 15A:
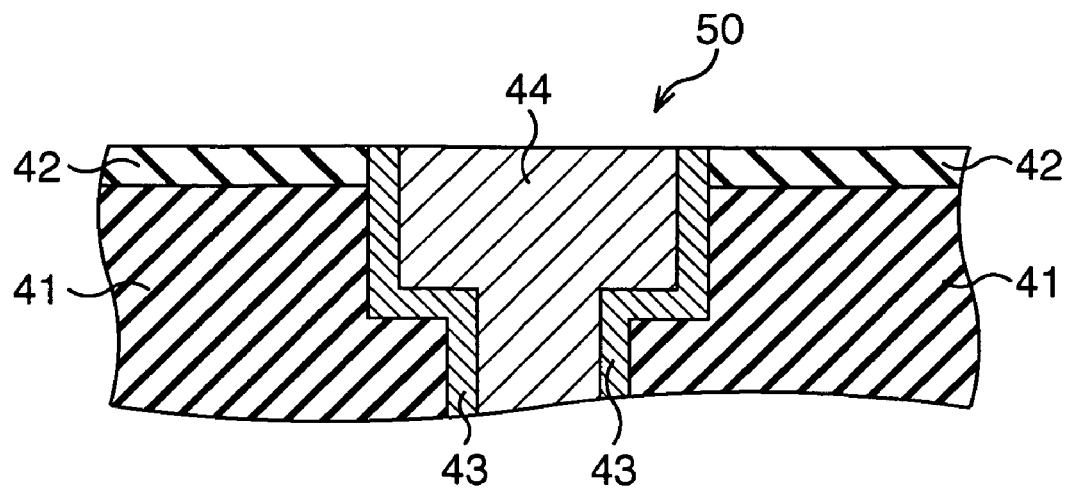
FIG. 15A to FIG. 15E are cross-sectional views showing, in the order of processes, a manufacturing method of a semiconductor device according to a second embodiment of the present invention.

In this embodiment, after semiconductor elements (not shown) such as transistors are formed on a surface of a semiconductor substrate (not shown), a coating-type organic, for example, interlayer insulation film 41 and a CMP stopper film 42 are sequentially formed thereon or thereabove, as shown in FIG. 15A. In this embodiment, a first insulation film is composed of the interlayer insulation film 41 and the CMP stopper film 42. Then, via plugs and wiring trenches are formed in the interlayer insulation film 41 and the CMP stopper film 42 by etching using masks as required. Next, a barrier metal film 43 is formed on the entire surface by a CVD method, and a Cu film 44 is further formed on the entire surface by a plating method or the like so as to be buried in the wiring trenches. Next, the Cu film 44 and the barrier metal film 43 are planarized by CMP or the like until the CMP stopper film 42 is exposed, whereby lower wirings 50 are formed.

Figure 15B:
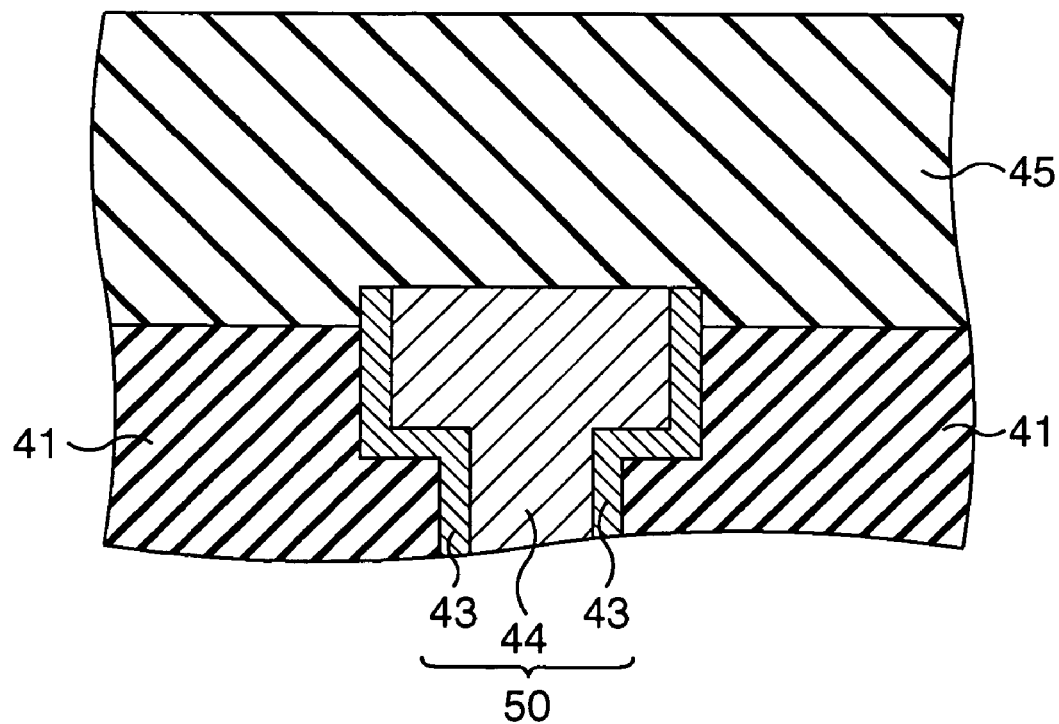

Thereafter, the CMP stopper film 42 is removed by dry etching, so that surfaces of the lower wirings 50 relatively protrude from their surrounding area. Further, the interlayer insulation film 41 may be made retreated as required so that the lower wirings 50 protrude more. A protrusion degree of the lower wirings 50 preferably falls within, for example, the preferable range of the protrusion degree of the lower wirings 17 (first embodiment). Subsequently, as shown in FIG. 15B, a coating-type organic, for example, interlayer insulation film 45 is formed on the entire surface.

Figure 15C:
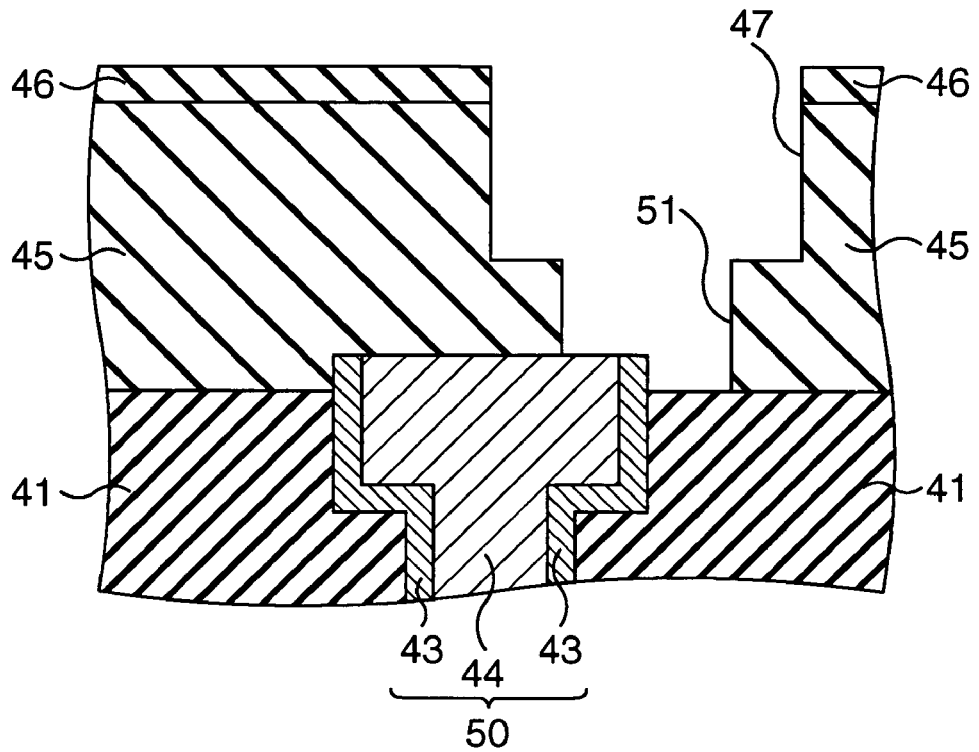

Next, as shown in FIG. 15C, a CMP stopper film 46 is formed on the interlayer insulation film 45. In this embodiment, a second insulation film is composed of the interlayer insulation film 45 and the CMP stopper film 46. Then, by etching using masks as required, via holes 51 and wiring trenches 47 are formed in the interlayer insulation film 45 and the CMP stopper film 46. At this time, target positions where the via holes 51 are formed are positions right above the lower wirings 50, but misalignment may occur due to deviation at the time of exposure or the like, as shown in FIG. 15C.

Figure 15D:
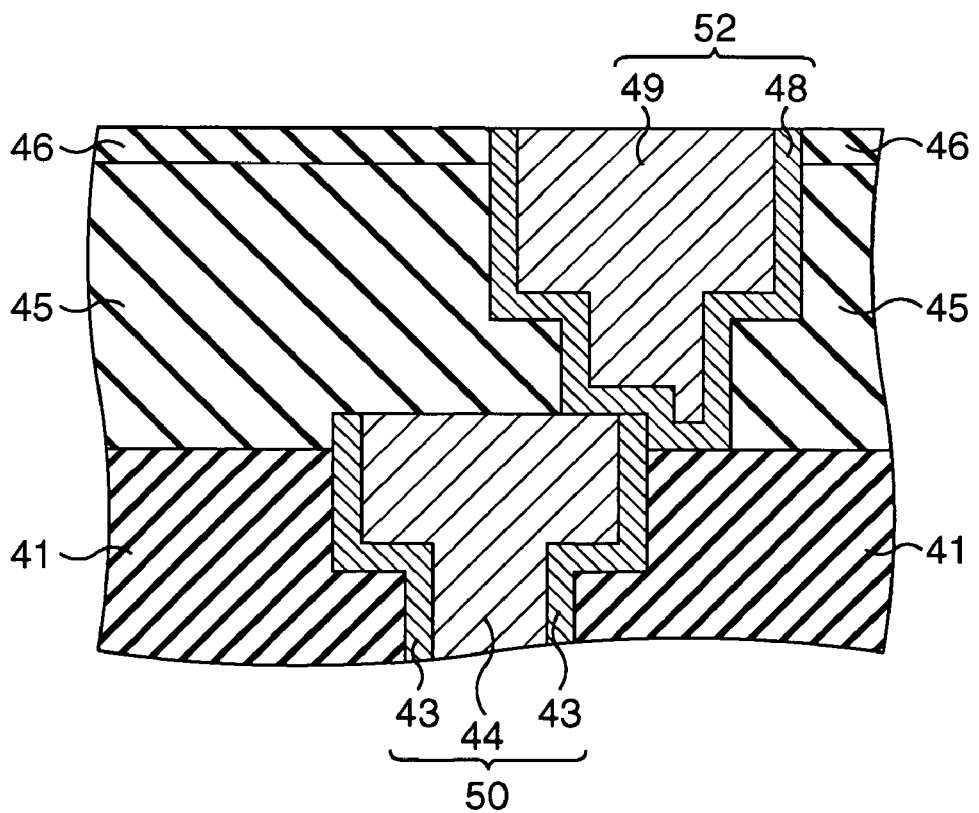

Next, a barrier metal film 48 is formed on the entire surface by a CVD method, and a Cu film 49 is further formed on the entire surface by a plating method or the like so as to be buried in the via holes 51 and the wiring trenches 47. Thereafter, the Cu film 49 and the barrier metal film 48 are planarized by CMP or the like until the CMP stopper film 46 is exposed, whereby upper wirings 52 are formed as shown in FIG. 15D.

Figure 15E:
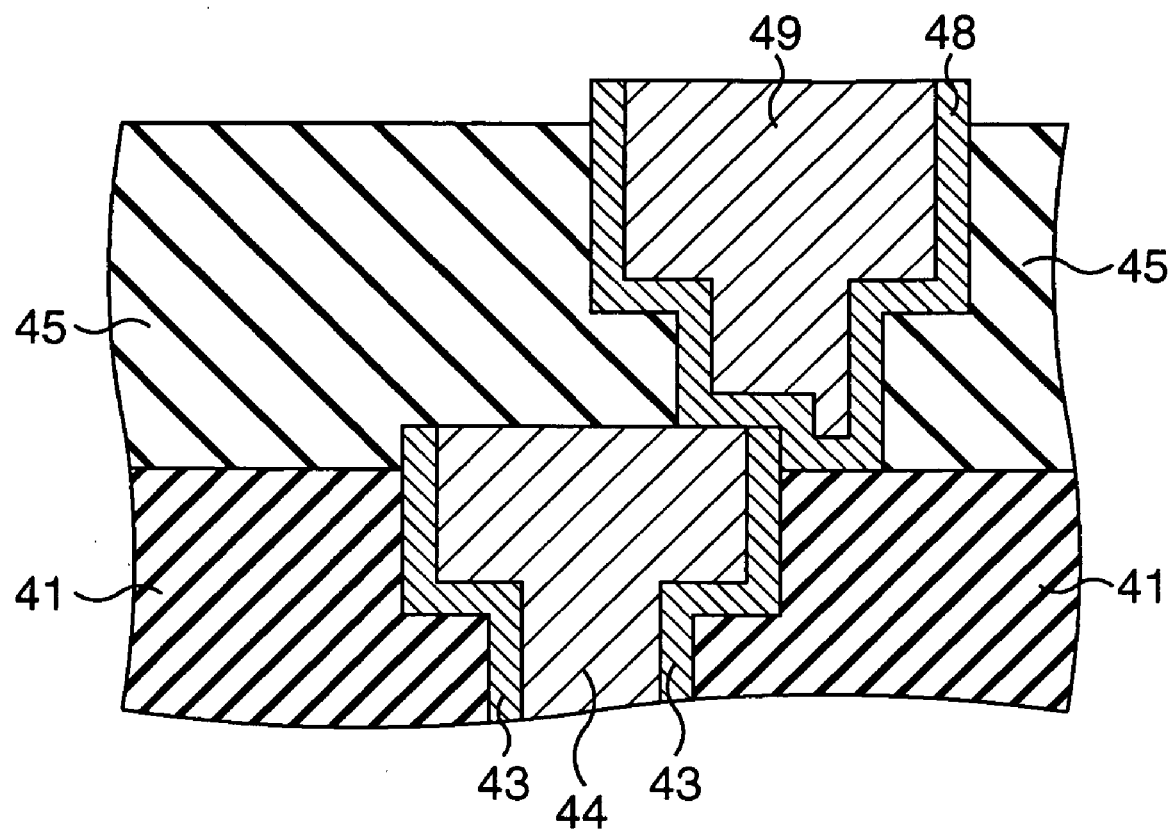
Figure 16A:
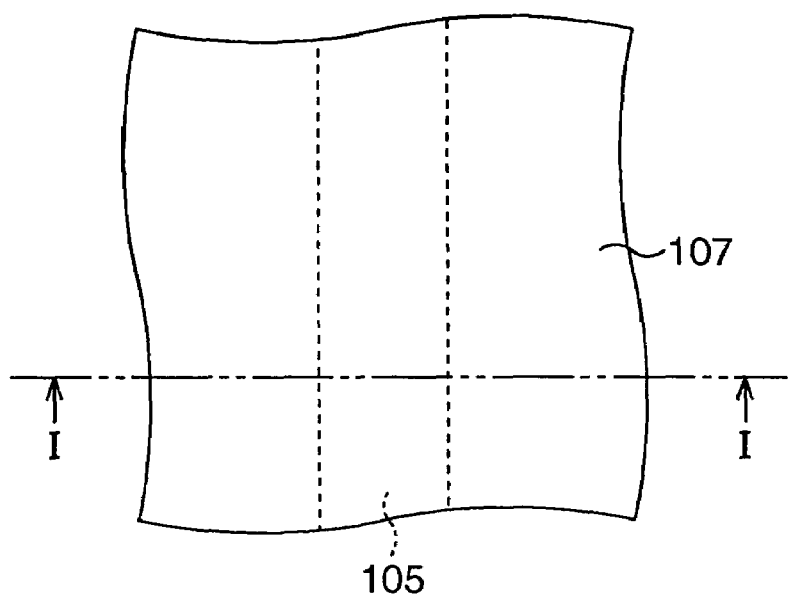
FIG. 16A and FIG. 16B are views showing a manufacturing method of a semiconductor device, using a conventional single damascene method.
Figure 16B:
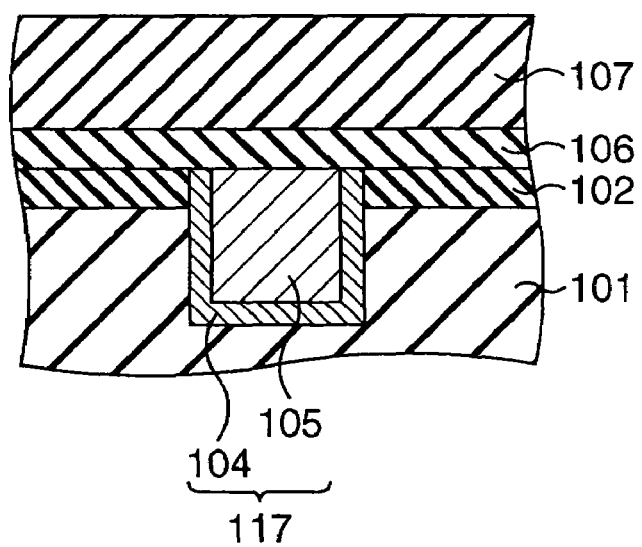
Figure 17A:
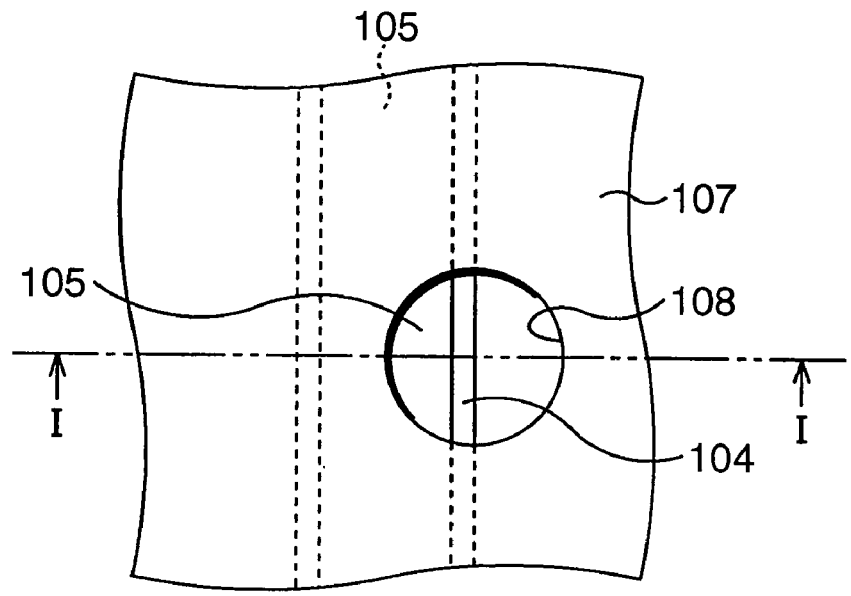
FIG. 17A and FIG. 17B are views, subsequent to FIG. 16A and FIG. 16B, showing the manufacturing method of the semiconductor device, using the conventional single damascene method.
Figure 17B:
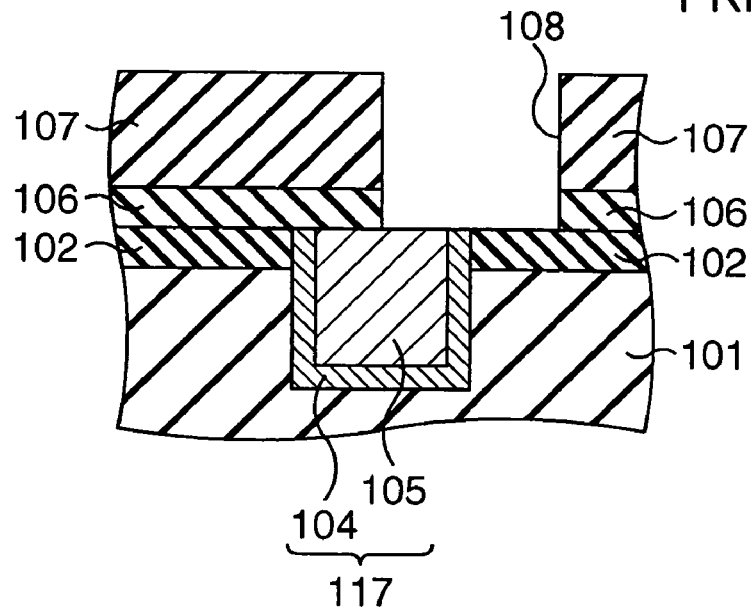
Figure 18A:
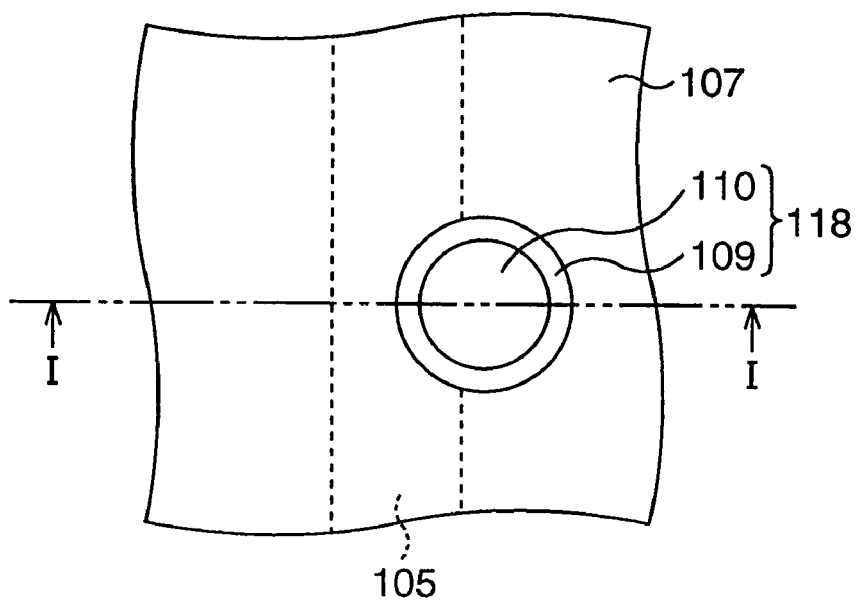
FIG. 18A and FIG. 18B are views, subsequent to FIG. 17A and FIG. 17B, showing the manufacturing method of the semiconductor device, using the conventional single damascene method.
Figure 18B:
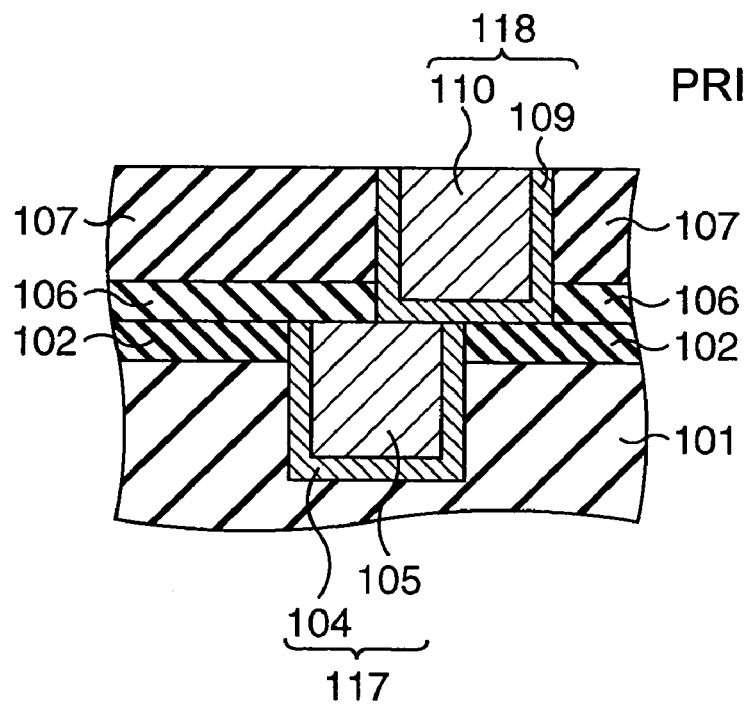
Figure 19A:
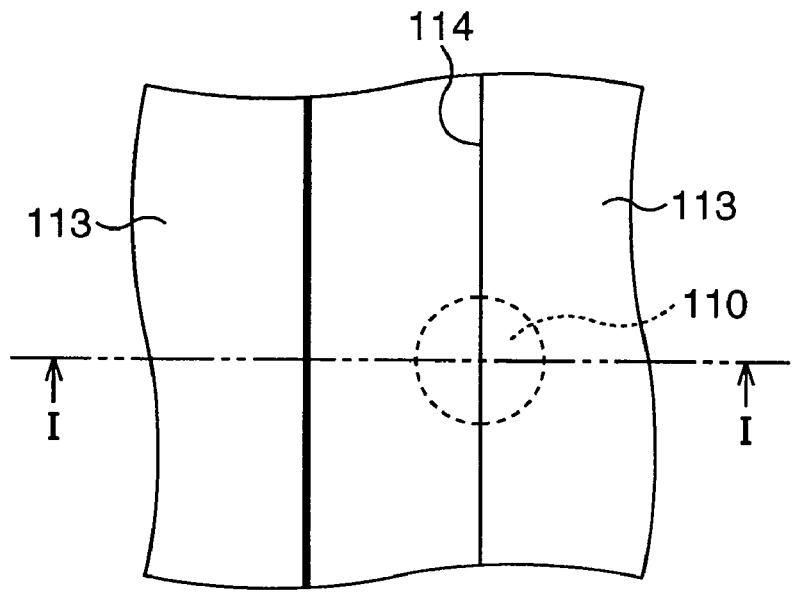
FIG. 19A and FIG. 19B are views, subsequent to FIG. 18A and FIG. 18B, showing the manufacturing method of the semiconductor device, using the conventional single damascene method.
Figure 19B:
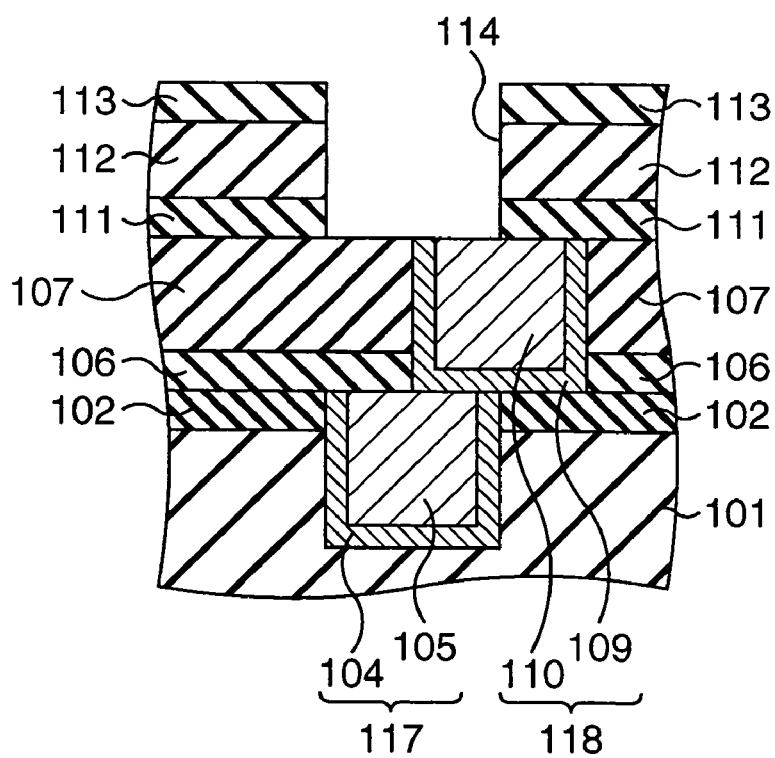

Subsequently, the CMP stopper film 46 is removed by dry etching, so that surfaces of the upper wirings 52 relatively protrude from their surrounding area as shown in FIG. 15E. Further, the interlayer insulation film 45 may be made retreated as required so that the upper wirings 52 protrude more. A protrusion degree of the upper wirings 52 preferably falls within, for example, the preferable range of the protrusion degree of the lower wirings 17 (first embodiment).

Thereafter, a multilayer wiring structure and the like are formed as required, whereby the semiconductor device is completed.

The second embodiment as described above can provide the same effects as those of the first embodiment. However, in the dual damascene method, the via plugs and the wirings thereon are formed simultaneously, and thus they need not be made in contact with each other via side surfaces.

Incidentally, in these embodiments, dry etching is adopted as the etching for making the via plugs or the wirings protrude from the insulation films, but wet etching may be adopted as this etching. In the case of the wet etching, an etching solution used for etching a Si oxide film preferably contains hydrofluoric acid, and an etching solution used for etching a Si carbide film or a Si nitride film preferably contains phosphoric acid. Further, these kinds of etching may proceed simultaneously with cleaning after CMP.

INDUSTRIAL APPLICABILITY

As has been described in detail above, according to the present invention, it is possible to secure a contact area of a via plug and a wiring surely and sufficiently. This makes it possible to reduce an increase in contact resistance. In addition, high reliability can be obtained.

What is claimed is:

1. A semiconductor device comprising:
a first wiring buried in a first interlayer insulation film;
a second wiring formed above said first wiring and buried in a second interlayer insulation film; and
a via plug electrically connecting said first wiring and said second wiring to each other and buried in a third interlayer insulation film,
said first wiring and said via plug being electrically connected to each other, with a lower surface of said via plug being in contact with an upper surface of said first wiring and an upper surface of the first interlayer insulation film, and a side surface of said first wiring and a side surface of said via plug being in contact with each other, and
said via plug and said second wiring being electrically connected to each other, with a lower surface of said second wiring being in contact with an upper surface of said via plug and an upper surface of the third interlayer insulation film, and a side surface of said via plug and a side surface of said second wiring being in contact with each other.

2. The semiconductor device according to claim 1, wherein, when an area of said via plug in a plane view is "S", a contact area of said first wiring and said via plug is equal to or larger than "S", and a contact area of said via plug and said second wiring is equal to or larger than "S".

3. The semiconductor device according to claim 1, wherein, when a planar shape of said via plug is a circle, a height of a portion of the side surface of said first wiring in contact with the side surface of said via plug is equal to or more than $\pi a/4$, where "a" is a radius of the circle.

4. The semiconductor device according to claim 1, wherein, when a planar shape of said via plug is a circle, a height of a portion of the side surface of said via plug in contact with the side surface of said second wiring is equal to or more than b/2, where "b" is a radius of the circle.

5. The semiconductor device according to claim 1, wherein said first wiring and said second wiring are buried in organic interlayer insulation films in different layers.

* * * * *

UNITED STATES PATENT AND TRADEMARK OFFICE
CERTIFICATE OF CORRECTION

PATENT NO.       : 7,514,792 B2
APPLICATION NO.  : 11/393655
DATED            : April 7, 2009
INVENTOR(S)      : Akihiro Hasegawa It is certified that error appears in the above-identified patent and that said Letters Patent is hereby corrected as shown below:

Title Page, in Item 73:
Change the Assignee name
"Fujitsu Limited" to be --Fujitsu Microelectronics Limited--

Signed and Sealed this
Fourteenth Day of June, 2011

David J. Kappos
*Director of the United States Patent and Trademark Office*